(12) United States Patent
Lee

(10) Patent No.: US 7,459,025 B2
(45) Date of Patent: Dec. 2, 2008

(54) METHODS FOR TRANSFERRING A LAYER ONTO A SUBSTRATE

(76) Inventor: Tien-Hsi Lee, 6527 Knott Ave., El Cerrito, CA (US) 94530

( * ) Notice: Subject to any disclaimer, the term of this patent is extended or adjusted under 35 U.S.C. 154(b) by 242 days.

(21) Appl. No.: 10/454,099

(22) Filed: Jun. 3, 2003

(65) Prior Publication Data

US 2008/0223285 A1    Sep. 18, 2008

Related U.S. Application Data

(60) Provisional application No. 60/385,333, filed on Jun. 3, 2002.

(51) Int. Cl.
*C30B 25/12* (2006.01)
*C30B 25/14* (2006.01)

(52) U.S. Cl. .............. 117/88; 117/2; 117/90; 117/92; 117/94; 117/95; 438/148; 438/458

(58) Field of Classification Search ............ 117/2, 117/3, 89, 92, 88, 90, 94, 95
See application file for complete search history.

(56) References Cited

U.S. PATENT DOCUMENTS

| | | |
|---|---|---|
| 5,250,460 A | 10/1993 | Yamagata et al. |
| 5,374,564 A | 12/1994 | Bruel |
| 5,877,070 A | 3/1999 | Goesele et al. |
| 6,191,007 B1 | 2/2001 | Matsui et al. |
| 6,207,005 B1 | 3/2001 | Henley et al. |
| 6,225,192 B1 | 5/2001 | Aspar et al. |
| 6,255,195 B1 | 7/2001 | Linn et al. |
| 6,346,458 B1 | 2/2002 | Bower |
| 6,352,909 B1 | 3/2002 | Usenko |
| 6,486,008 B1 | 11/2002 | Lee |
| 6,562,703 B1 | 5/2003 | Maa et al. |

*Primary Examiner*—Felisa C Hiteshew
(74) *Attorney, Agent, or Firm*—Reed Smith LLP; Stanley P. Fisher, Esq.; Juan Carlos A. Marquez, Esq.

(57) ABSTRACT

Systems and methods for transferring a thin film from a substrate onto another substrate, a layer of the same area as the substrate, of a thickness from sub-micron to tens of micron, and of the thickness and flatness required by VLSI and MEMS applications, and with sufficiently low defect density in the transferred layer are disclosed. The method enables separating a solid layer from a supply substrate and optionally transferring the solid layer onto a target substrate. The method generally includes providing the solid layer on a hydrogen recombination region containing hydrogen-recombination-dopant at a concentration higher than that of the solid layer. The supply substrate includes the solid layer, a mother substrate, and the hydrogen recombination region. The hydrogen recombination region may form a part of the mother substrate or may be separate therefrom. Hydrogen atoms are promoted into the supply substrate to convert the hydrogen recombination region to a hydrogen-embitterment region which is then volatilized to form a void region, thereby separating the solid layer from the remainder of the supply substrate. The supply substrate may be bonded to the target substrate prior to the volatilizing so as to transfer the solid layer to the target substrate. The solid layer may be formed by epitaxial growth or by ion implantation.

22 Claims, 7 Drawing Sheets

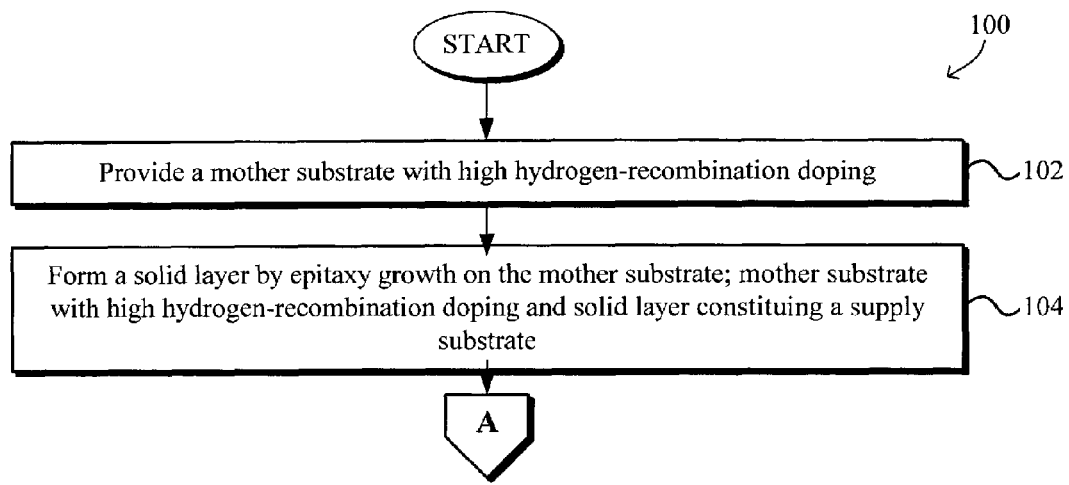
FIG. 5
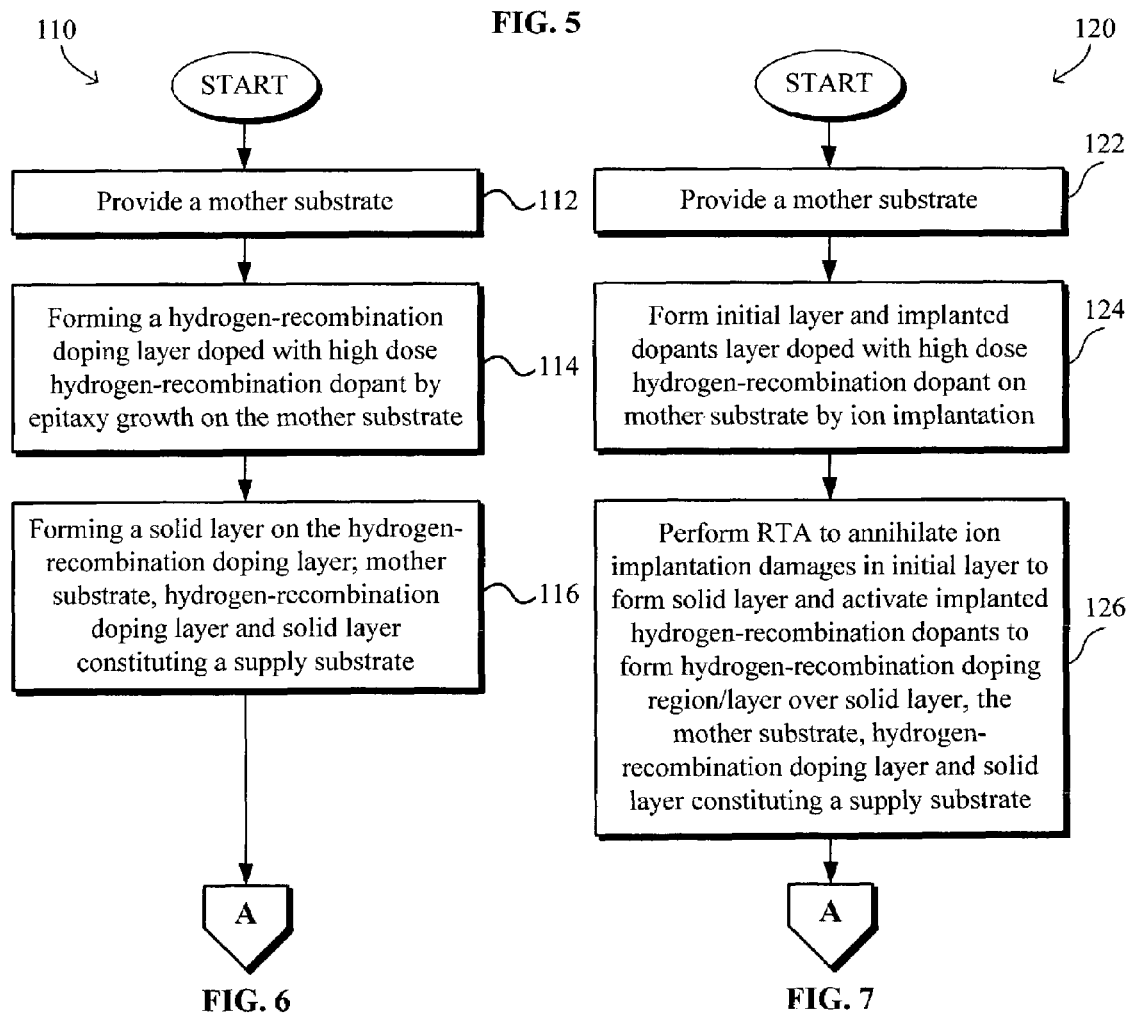
FIG. 6
FIG. 7

| TABLE I | | | |
|---|---|---|---|
| Solid Layer for Layer Transfer to Target Substrate | Hydrogenation to Form Hydrogen-Embitterment Layer | External Energy to Separate Solid Layer From Supply Substrate | Transferred Solid Layer |
| 0.35 μm thick | Plasma jet for at least 30 minutes | Microwave irradiation, 2.45GMz for 5 minutes | 0.4 μm thick |
| 1.5 μm thick | Plasma jet for 120 minutes | Heat at 800°C for 5 minutes | 1.5 μm thick |
| 1.5 μm thick | Plasma jet for 120 minutes | Heat at 800°C for 10 minutes | 1.7 μm thick |
| 1.5 μm thick | Electrolytic setup charged for 150 minutes | Heat at 800°C for 10 minutes | 1.7 μm thick |
| 0.50 μm thick | Electrolytic setup charged for 100 minutes | Heat at 800°C for 15 minutes | 0.4μm thick |

FIG. 9

METHODS FOR TRANSFERRING A LAYER ONTO A SUBSTRATE

CROSS REFERENCE TO RELATED APPLICATIONS

This application claims priority to U.S. Provisional Patent Application Ser. No. 60/385,333, filed on Jun. 3, 2002, entitled "Transferring Method of a Layer Onto a Substrate," which is incorporated herein by reference in its entirety.

BACKGROUND OF THE INVENTION

1. Field of the Invention

The present invention relates generally to a semiconductor layer transferring method. More specifically, systems and methods for transferring a thin film from a substrate onto another substrate, a layer of the same area as the substrate, of a thickness from sub-micron to tens of micron, and of the thickness and flatness required by VLSI and MEMS applications, and with sufficiently low defect density in the transferred layer are disclosed.

2. Description of Related Art

Wafer bonding technology can be applied to join two substrates of very different lattice parameters without glue, resulting in a sufficiently high bonding strength such that the bonding interface is as strong as the substrate. The wafer bonding technology has been extended with layer transfer concept in which an etch stop layer is used to fabricate sub-micron thickness silicon on silicon dioxide to form a silicon on insulator (SOI) material.

The wafer bonding technology combined with layer transfer concept extended the applicable field to include advanced electric materials, opto-electronics materials, and microelectro-mechanical systems (MEMS) fabrication. However, the layer transfer technology based on etch stop concept has some disadvantages, such as the problems related to total thickness variation (TTV) due to uniformity of etch stopping. In addition, the etching process is time consuming and most of substrate is wasted.

A Separation by Implantation Oxygen (SIMOX) method was developed to manufacture SOI substrate. Because the SIMOX-based SOI substrate provides superior uniform thickness, wafer bonding technology may lose its leadership in the field of SOI wafer production if its TTV value is not improved.

U.S. Pat. No. 5,374,564, entitled "Process for the Production of Thin Semiconductor Material Films" to Bruel discloses a layer transfer technology, known as Smart Cut® process. With Bruel's approach, the thickness of bonding-based SOI substrate can be made as well as with the SIMOX-based SOI. In particular, an implantation process is performed first to implant a high dosage of hydrogen ions into a supply substrate and the supply substrate is bonded onto a target substrate. A thermal treating process is then performed to cause the formation of a platelet layer along an implanted peak to separate a layer from the supply substrate and transfer the separate layer onto the target substrate. The Smart Cut® process was quickly adopted into the mainstream SOI substrate manufacturing method as it provides uniform thickness of thin film, less defects in density, no wasted materials, released hydrogen being harmless, and the reusability of the supply substrates.

Another SOI fabrication process, Genesis Process™, developed by Silicon Genesis Corp., uses plasma immersion ion implantation (PIII) technology to implant hydrogen ions into silicon for thin film transferring purposes. This process is similar to the Smart Cut® process but the ion implantation process is replaced with the PIII process and the splitting temperature can be reduced to below 500° C.

Various are other SOI substrate fabrication methods are also known. However, the Smart Cut® and other method transferring processes have several disadvantages. For example, a high dose hydrogen ion implantation process may cause a high defect density in active layer (SOI layer). Defects and deformations in an active layer due to the ion implantation of heavy atoms such as silicon may cause quality issues with the active layer and may be difficult to repair by an annealing process. In addition, the manufacturing is costly due to the use of high ion implantation dosage. Further, a fine void existence of the crystal originated particles or pits (COPs) produced in a bulk wafer, especially in a 300 mm diameter wafer, cannot be totally eliminated and causes severe defect problems in the active layer. The thickness of the transferred layer may be restricted by implantation energy and can be very difficult beyond thickness of microns. The nano size porous silicon formation and following silicon epitaxy growth is complex and relative manufacturing costly. As yet another example, defects of oxide segregation in the active layer due to the oxygen ion implantation process may cause quality issues for IC device manufacturing.

Thus, what is needed is an improved system and method for transfer of an epitaxial layer from a supply substrate onto a target substrate without or with minimal implant damage. Ideally, the process is cost effective and provides a high quality active layer, with reduced COPs defects and reduced implant damage and with excellent and flexile thickness control.

SUMMARY OF THE INVENTION

Systems and methods for transferring a thin film from a substrate onto another substrate, a layer of the same area as the substrate, of a thickness from sub-micron to tens of micron, and of the thickness and flatness required by VLSI and MEMS applications, and with sufficiently low defect density in the transferred layer are disclosed. It should be appreciated that the present invention can be implemented in numerous ways, including as a process, an apparatus, a system, a device, a method, or a computer readable medium such as a computer readable storage medium or a computer network wherein program instructions are sent over optical or electronic communication lines. Several inventive embodiments of the present invention are described below.

The method enables separating a solid layer from a supply substrate and optionally transferring the solid layer onto a target substrate. The method generally includes providing the solid layer on a hydrogen recombination region containing hydrogen-recombination-dopant at a concentration higher than that of the solid layer. The supply substrate includes the solid layer, a mother substrate, and the hydrogen recombination region. The hydrogen recombination region may form a part of the mother substrate or may be separate therefrom. Hydrogen atoms are promoted into the supply substrate to convert the hydrogen recombination region to a hydrogen-embitterment region which is then volatilized to form a void region, thereby separating the solid layer from the remainder of the supply substrate. The supply substrate may be bonded to the target substrate prior to the volatilizing so as to transfer the solid layer to the target substrate. The solid layer may be formed by epitaxial growth or by ion implantation.

In one preferred embodiment, an epitaxial growth process is performed to form a solid layer on a top surface of a substrate on or in which exist areas containing sufficiently high hydrogen recombination dopants to form a supply substrate. The hydrogen recombination dopant, e.g. boron, aluminum, gallium, carbon, not only has a recombination effect for transforming diffused hydrogen ions into gas molecules but also promotes the dissolution ability of the substrate to allow more atomic hydrogen to enter. Once inside the supply substrate, atomic hydrogen ions are bonded with the hydrogen recombination dopants to reach a sufficiently high solute concentration. The diffused atomic hydrogen ions are more easily recombined to form hydrogen molecules and to cause blisters and cracks in the region with higher hydrogen recombination doping than the region with lighter hydrogen recombination doping, i.e., the solid layer, at the same annealing temperature. The solid layer also can be doped with hydrogen recombination poisons, e.g. sulphur, phosphorous, arsenic, to retard the hydrogen recombination process and promote the absorption of hydrogen ions in the solid layer. This different-dose doping and hydrogen recombination retardant can cause the different timing in hydrogen blistering and cracking between the solid layer (no or light hydrogen recombination doping) and the hydrogen recombination region (high hydrogen recombination doping).

The hydrogen recombination region is defined by a surface of the high hydrogen recombination doping substrate proximate the solid layer and extending a sufficient depth for layer splitting purposes. The high hydrogen recombination doping substrate can be a mother substrate to directly grow the solid layer on the mother substrate. Alternatively, the high hydrogen recombination doping substrate can be formed by epitaxial growth on a light hydrogen recombination doping mother substrate. A hydrogen diffusion process is performed to promote hydrogen atoms into the supply substrate to convert the hydrogen recombination region to a hydrogen-embitterment region.

A wafer bonding process is then performed to bond a target substrate onto the supply substrate to form a bonded pair with a sufficiently high bonding strength. An active energy is input into the bonded pair such as by placing the bonded pair into a high temperature chamber, a high frequency alternating electric field, or a high frequency alternating electromagnetic field to perform a hydrogen recombination process to form molecular hydrogen gas and to transform the hydrogen-embitterment region to a void region. The formation of internal hydrogen blisters or blister-like cracks at internal delamination reduces the bonding strength of the solid layer and the top surface of the substrate. These internal cracks propagate by a process called hydrogen-induced cracking (HIC) and/or hydrogen blistering and the process of hydrogen-assisted microvoid coalesce to form a continuous void layer to separate the solid layer from the supply substrate and transfer it onto the target substrate. Using heat, microwaves, radio frequency, and/or inductively coupled field as an active energy which increases the kinetic energy of the diffused hydrogen ions can facilitate the hydrogen recombination process. The magnitude of input active energy is controlled to cause the hydrogen induced blistering and cracking in the hydrogen-embitterment region but not in the transfer layer, i.e., the solid layer.

The method may also be applied to perform a layer cutting process. One or more hydrogen-recombination region in a layer within a substrate may be formed using an epitaxial growth process. An active energy is applied into the layer to recombine the diffused hydrogen ions into gas molecules and a hydrogen-induced blistering and cracking is formed to separate the layer from the substrate, thereby cutting the layer from the substrate.

These and other features and advantages of the present invention will be presented in more detail in the following detailed description and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements.

FIGS. 5-8 are flowcharts illustrating the various embodiments of the process for transferring a thin film from a mother substrate onto a target substrate by forming a hydrogen-embitterment layer in the mother substrate.

FIG. 9 is a table illustrating various exemplary processes using different combinations hydrogenation and/or external energy application methods as well as different process parameters.

DESCRIPTION OF SPECIFIC EMBODIMENTS

Systems and methods for transferring a thin film from a substrate onto another substrate, a layer of the same area as the substrate, of a thickness from sub-micron to tens of micron, and of the thickness and flatness required by VLSI and MEMS applications, and with sufficiently low defect density in the transferred layer are disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

Figure 1:
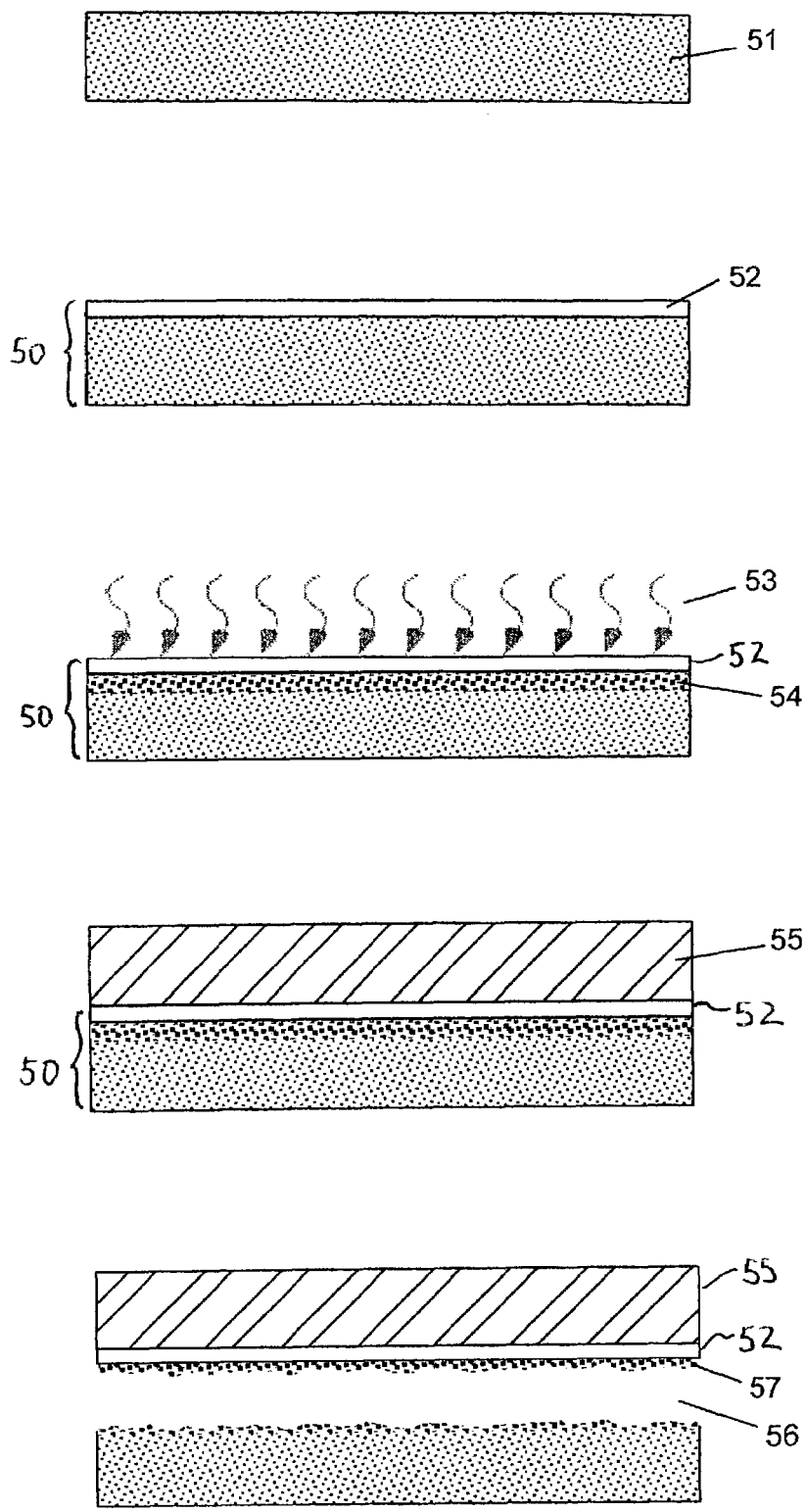
FIGS. 1-3 are schematic diagrams illustrating various embodiments of a process for transferring a thin film from a mother substrate onto a target substrate by forming a hydrogen-embitterment layer in the mother substrate.
Figure 2:
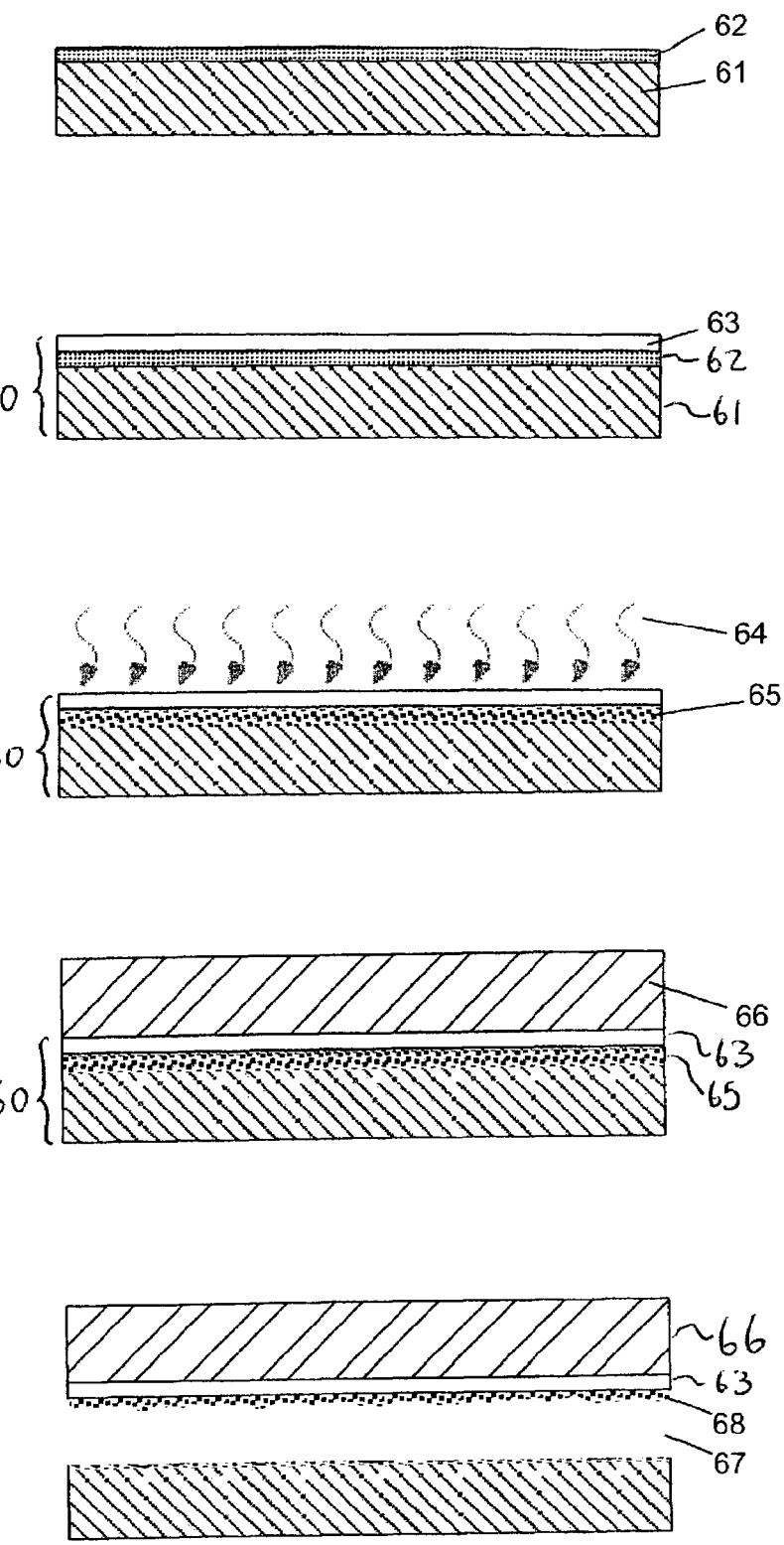
Figure 3:
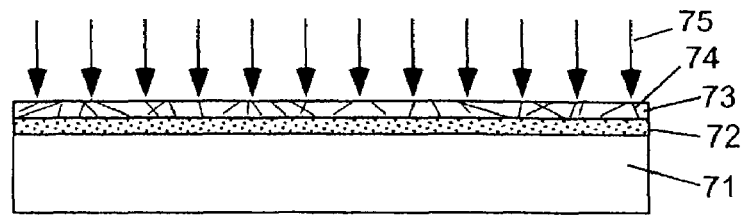
Figure 3:
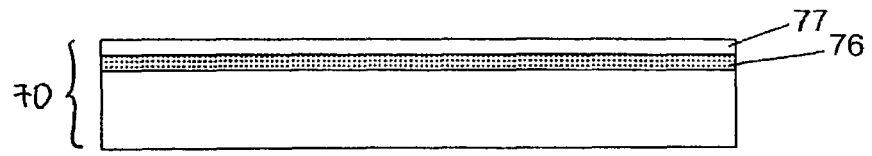
Figure 3:
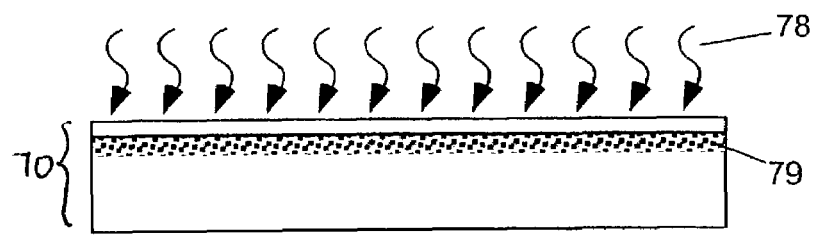
Figure 3:
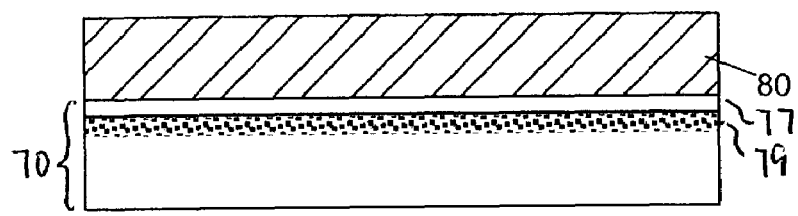
Figure 3:
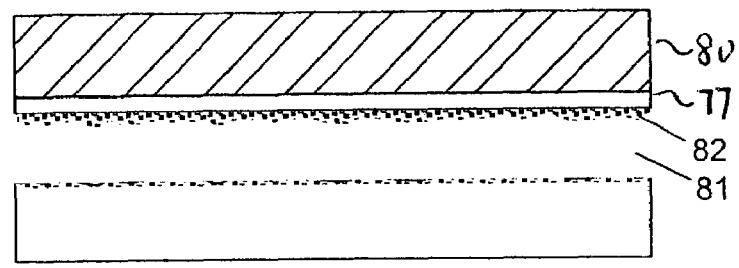

FIGS. 1-3 are schematic diagrams illustrating various embodiments of a process for transferring a thin film from a mother substrate onto a target substrate by forming a hydrogen-embitterment layer in the mother substrate. In particular, the process separates a solid layer from a hydrogen-embitterment layer in a supply substrate and thereby transfers the separated solid layer onto a target substrate.

Referring to FIG. 1, a mother substrate 51 such as silicon, silicon carbide, germanium, silicon germanium alloy, gallium arsenide, gallium nitride, aluminum nitride, or indium phosphide is provided. The mother substrate 51 is doped with a high dose hydrogen-recombination dopant. Any suitable hydrogen-recombination dopant such as boron, aluminum, gallium, and/or carbon may be used. The hydrogen recombination dopant not only has the recombination effect for transforming diffused hydrogen ions into gas molecules but also promotes the dissolution ability of the substrate to allow more atomic hydrogen to enter. The high dose hydrogen-recombination dopant enhances the effect of hydrogen recombination. Next, a solid layer 52 may be formed on the mother substrate 51 and together they form the supply substrate 50. The solid layer 52 may be formed using any suitable method such as an epitaxy growth process including vapor phase epitaxy deposition, liquid phase epitaxy deposition, molecular beam epitaxy deposition, and metal-organic chemical vapor deposition.

The dosage of hydrogen-recombination dopant in the solid layer 52 is lower than that in the mother substrate 51 to create a moderated hydrogen recombination effect. In addition, the solid layer 52 may be optionally doped with any suitable hydrogen recombination poison or retardant such as sulphur, phosphorous, and/or arsenic for retarding hydrogen recombination. Hydrogen atoms 53 are diffused or drifted into the supply substrate 50 through the solid layer 52. The hydrogen atoms 53 may be promoted into the supply substrate 50 by exposing the supply substrate 50 to, for example, a gas containing hydrogen ions and hydrogen molecules, a plasma source containing hydrogen plasma, and/or a liquid containing hydrogen ions. The hydrogen atoms 53 permeate into the mother substrate 51, interacting with the hydrogen recombination dopants in the mother substrate 51 and forming a hydrogen-embitterment region 54 of sufficient depth to be utilized for layer splitting purposes.

The supply substrate 50 is then bonded with a target substrate 55 by any suitable wafer bonding process to form a bonded wafer pair. An external energy field such as microwave irradiation and/or thermal treatment is applied to the bonded wafer pair to excite the hydrogen-embitterment layer 54 and thus triggering a hydrogen recombination process in the hydrogen-embitterment layer 54. In the hydrogen recombination process, the hydrogen atoms recombine to form molecular hydrogen (gas molecules) that accumulates to cause hydrogen-induced internal cracks, blisters and/or voids and form hydrogen-filled platelets in the hydrogen-embitterment layer 54. The hydrogen-filled platelets crumple into a continuous void layer 56 causing the solid layer 52 to separate from the mother substrate 51 and thereby transfer the solid layer 52 onto the target substrate 55. A remaining layer 57 of the hydrogen-embitterment layer 54 remaining on the solid layer 52 can be removed by any suitable method such as etching, polishing and/or annealing treatment.

FIG. 2 illustrates an alternative embodiment of the process for transferring a thin film (solid layer) from a mother substrate onto a target substrate by forming a hydrogen-embitterment layer in the mother substrate. In particular, a hydrogen-recombination doping layer 62 doped with high dose hydrogen-recombination dopant such as boron may be epitaxially grown on a mother substrate 61 such as silicon. Another epitaxy growth process may be carried out to form a solid layer 63 on the hydrogen-recombination doping layer 62. The mother substrate 61, hydrogen-recombination doping layer 62 and the solid layer 63 together form a supply substrate 60. The dosage of hydrogen-recombination dopant in the solid layer 63 is lower than that in the hydrogen-recombination doping layer 62 to create a moderated hydrogen recombination effect. In addition, during epitaxy growth process of the solid layer 63, the solid layer 63 may be doped with any suitable hydrogen recombination poison or retardant such as sulphur, phosphorous, and/or arsenic for retarding hydrogen recombination in the solid layer 63. Hydrogen atoms 64 are diffused or drifted into the supply substrate 60 through the solid layer 63. The hydrogen atoms 64 permeate into and interact with the hydrogen recombination dopants in the hydrogen-recombination doping layer 62 to form a hydrogen-embitterment region 65 to be utilized for layer splitting purpose.

The supply substrate 60 is then bonded with a target substrate 66 by any suitable wafer bonding process to form a bonded wafer pair. An external energy field such as microwave irradiation and/or thermal treatment is applied to the bonded pair to excite the hydrogen-embitterment layer 65 and thus triggering a hydrogen recombination process in the hydrogen-embitterment layer 65. In the hydrogen recombination process, the hydrogen atoms recombine to form molecular hydrogen that accumulates to cause internal cracks, blisters and/or voids and form hydrogen-filled platelets in the hydrogen-embitterment layer 65. The hydrogen-filled platelets crumple into a continuous void layer 67 causing the solid layer 63 to separate from the mother substrate 61 and thereby transfer the solid layer 63 onto the target substrate 66. A remaining layer 68 of the hydrogen-embitterment layer 65 remaining on the solid layer 63 can be removed by any suitable method such as etching, polishing and/or annealing treatment.

FIG. 3 illustrates another alternative embodiment of the process for transferring a thin film (solid layer) from a mother substrate onto a target substrate by forming a hydrogen-embitterment layer in the mother substrate. In particular, an initial layer 73 and an implanted dopants layer 72 doped with high dose hydrogen-recombination dopant such as boron are formed on a mother substrate 71 such as silicon by, for example, ion implantation 75. The initial layer 73 includes crystal disorder and damage 74 due to the ion implantation 75. A high temperature rapid thermal anneal (RTA) process of over preferably approximately 850° C. for a short annealing time such as less than approximately five minutes is performed. The high temperature RTA process annihilates the crystal disorder and damage 74 associated with ion implantation 75 in the initial layer 73 to form a solid layer 77 and also activates the hydrogen-recombination dopants in the implanted dopants layer 72 to transform the implanted dopants layer 72 to a hydrogen-recombination doping layer 76. The solid layer 77 is free from crystal disorder and damage 74 and is formed on the hydrogen-recombination doping layer 76. The mother substrate 71, the hydrogen-recombination doping layer 76 and the solid layer 77 together form a supply substrate 70. The dosage of hydrogen-recombination dopant in the solid layer 77 is lower than that in the hydrogen-recombination doping layer 76 to create a moderated hydrogen recombination effect. In addition, the solid layer 77 may be doped with any suitable hydrogen recombination poison or retardant such as sulphur, phosphorous, and/or arsenic for retarding hydrogen recombination in the solid layer 77. Hydrogen atoms 78 are diffused or drifted into the supply substrate 70 through the solid layer 77. The hydrogen atoms 78 permeate into and interact with the hydrogen recombination dopants in the hydrogen-recombination doping layer 76 to form a hydrogen-embitterment region 79 to be utilized for layer splitting purpose.

The supply substrate 70 is then bonded with a target substrate 80 by any suitable wafer bonding process to form a bonded wafer pair. An external energy field such as microwave irradiation and/or thermal treatment is applied to the bonded pair to excite the hydrogen-embitterment layer 79 and thus triggering a hydrogen recombination process in the hydrogen-embitterment layer 79. In the hydrogen recombination process, the hydrogen atoms recombine to form molecular hydrogen that can accumulates to cause internal cracks, blisters and/or voids and form hydrogen-filled platelets in the hydrogen-embitterment layer 79. The hydrogen-filled platelets crumple into a continuous void layer 81 causing the solid layer 77 to separate from the mother substrate 71 and thereby transfer the solid layer 77 onto the target substrate 80. The remaining layer 82 of the hydrogen-embitterment layer 79 remaining on the solid layer 77 can be removed by any suitable method such as etching, polishing and/or annealing treatment.

Figure 4:
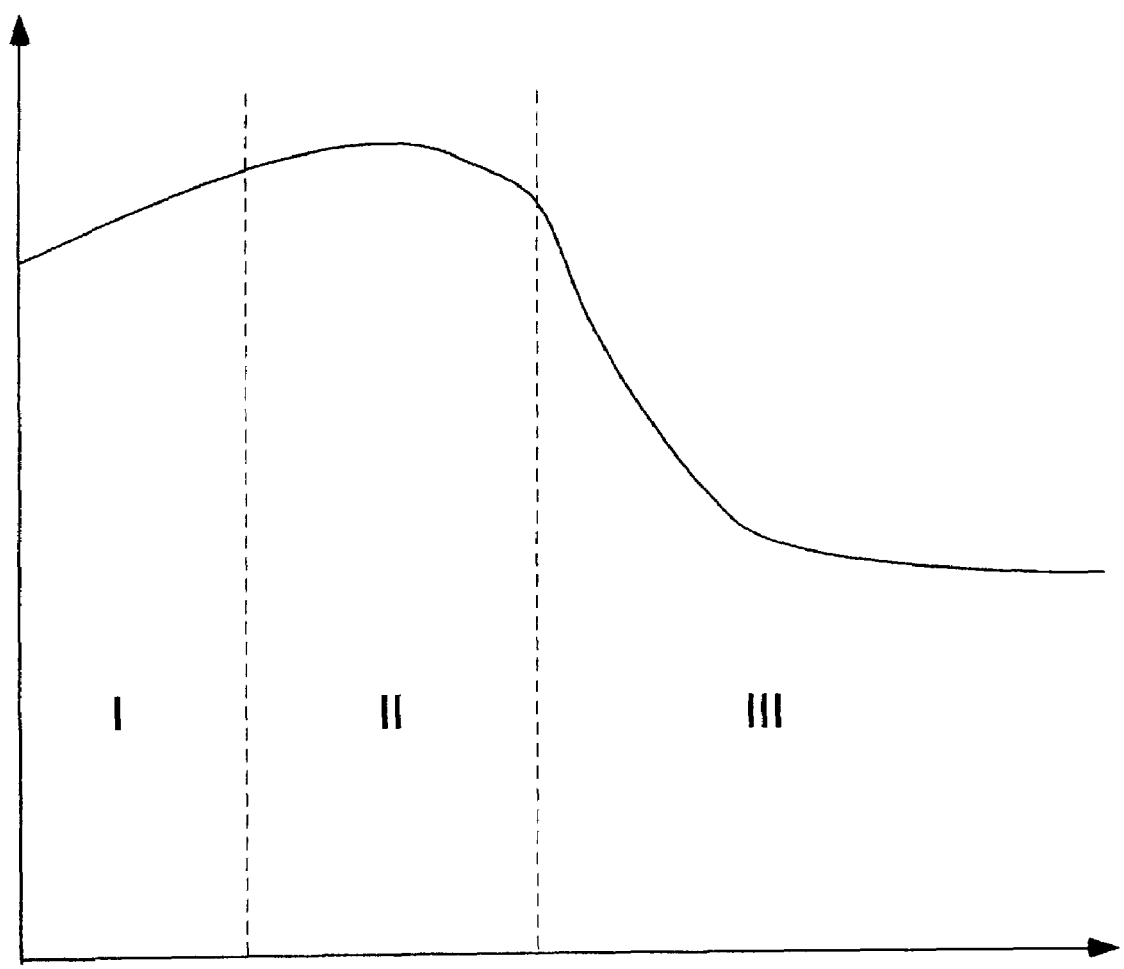
FIG. 4 illustrates hydrogen diffusion profile for a supply substrate having a solid layer (I), a high hydrogen-recombination doping region (II), and a mother substrate (III), the solid layer being separated from the mother substrate via the high hydrogen-recombination doping region for transfer to a target substrate.
Figure 4:
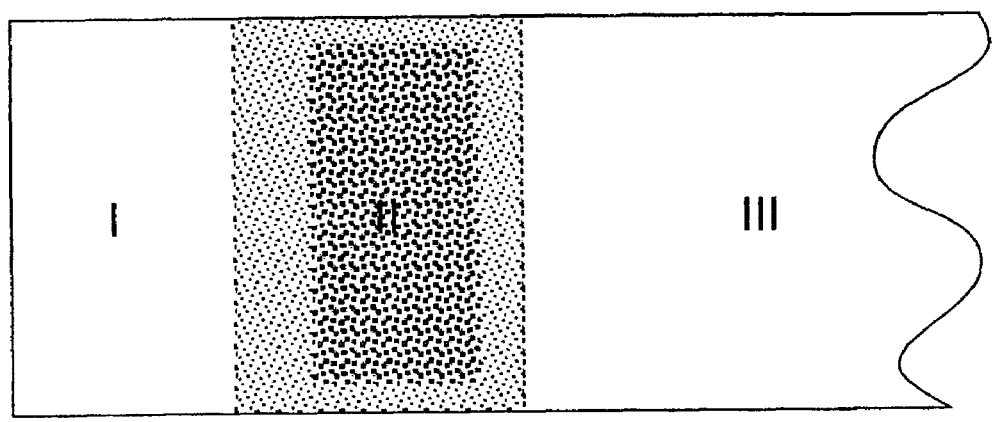

FIG. 4 illustrates hydrogen diffusion profile for a supply substrate having a solid layer (I), a high hydrogen-recombination doping region (II), and a mother substrate (III), the solid layer being separated from the mother substrate via the high hydrogen-recombination doping region for transfer to a target substrate. The solid layer (I), region I has no or light hydrogen-recombination doping. The top layer (II) is doped with high dose hydrogen-recombination dopant. The mother substrate (III) can be doped with no, light or high dose hydrogen-recombination dopant. The generation time for voiding and blistering when energy irradiation is applied are different for the solid layer (region I) and in the top layer (region II) due to their different doses of hydrogen-recombination doping. In particular, the top layer (II) voids and blisters before the solid layer (region I) does so as to cause the solid layer (I) to split from the top layer (II).

Figure 8:
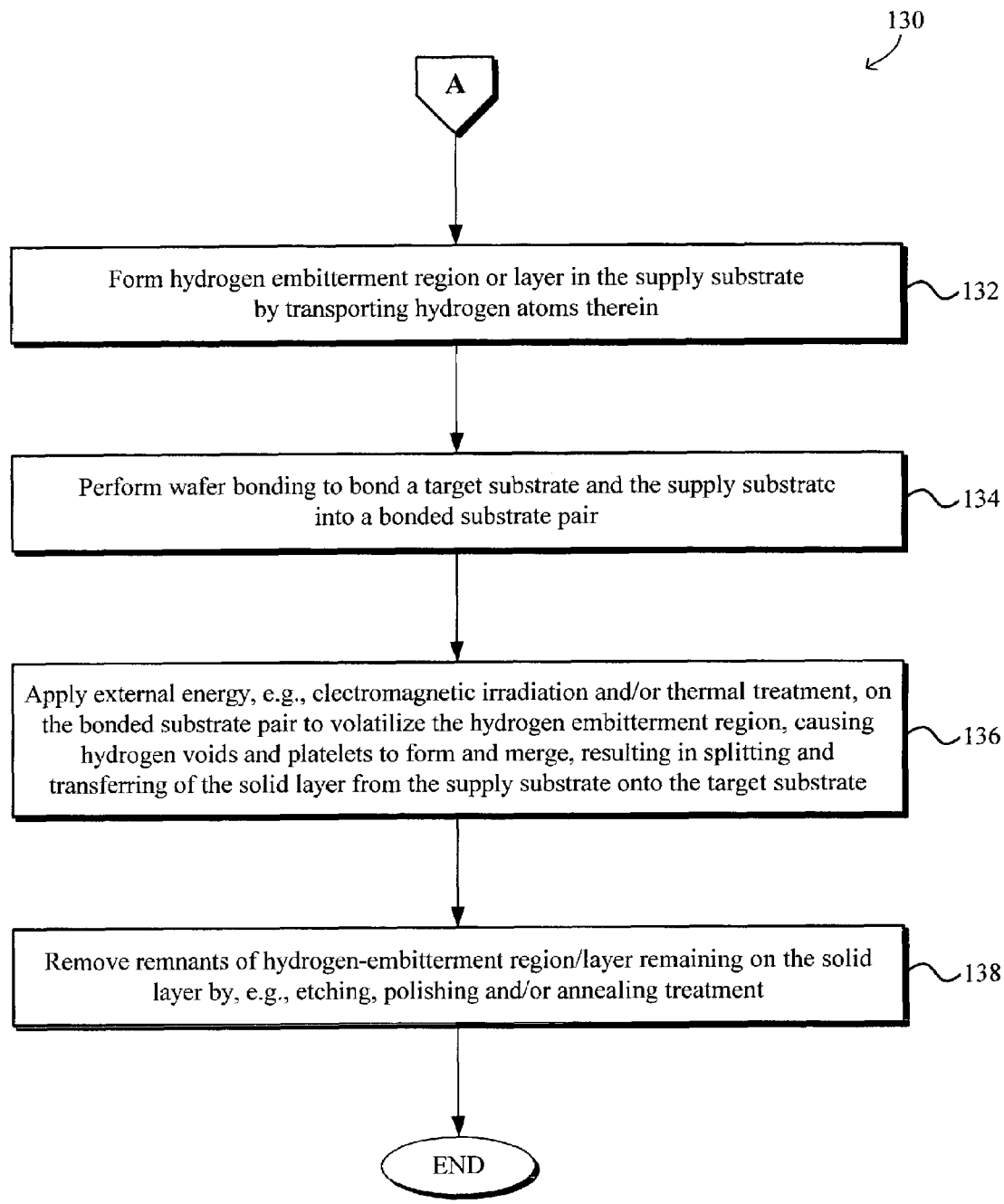

The above-described solid layer thin film transfer processes utilizes various processes to create a supply substrate from which a hydrogen-embitterment layer is formed for solid layer transferring. The different processes for creating the supply substrate from which the hydrogen-embitterment layer is formed are further illustrated by the flowcharts of FIGS. 5-7. After the supply substrate is formed, the hydrogen-embitterment layer is formed in the supply substrate and a thin film is transferred from the supply substrate onto a target substrate utilizing the hydrogen-embitterment layer, as shown in the flowchart of FIG. 8. Each of these processes associated with FIGS. 5-8 will now be described in more detail below.

FIG. 5 is a flowchart illustrating a process 100 for directly growing a solid layer over a mother substrate that is more highly doped with hydrogen recombination dopants. In particular, at step 102, a mother substrate with a high hydrogen-recombination doping is provided. Next, at step 104, a solid layer is formed by epitaxy growth on the mother substrate. The mother substrate with high hydrogen recombination doping and the solid layer constitute a supply substrate.

FIG. 6 is a flowchart illustrating a process 110 for directly growing a hydrogen-recombination doping layer with high dose hydrogen-recombination doping on a mother substrate and then growing a solid layer on the hydrogen-recombination doping layer to form a sandwiched supply substrate. In particular, a mother substrate is provided at step 112 and a hydrogen-recombination doping layer doped with a high dose of hydrogen-recombination dopant is formed, e.g., by epitaxy growth, on the mother substrate at step 114. At step 116, a solid layer is formed on the hydrogen-recombination doping layer, e.g., by epitaxy growth. The mother substrate, the hydrogen-recombination doping layer and the solid layer constitute a supply substrate.

FIG. 7 is a flowchart illustrating a process 120 for utilizing ion implantation and RTA to form an implant-damage-free, high hydrogen-recombination doping layer with activated dopants. In particular, a mother substrate is provided at step 122 and an initial layer and an implanted dopants layer doped with high dose hydrogen-recombination dopant are formed on the mother substrate by ion implantation at step 124. At step 126, a high temperature rapid thermal anneal (RTA) process is performed. Preferably, the high temperature RTA process is performed at over approximately 850° C. for a short annealing time such as less than approximately five minutes. The RTA process annihilates ion implantation damages in the initial layer to form a solid layer and activates the implanted hydrogen-recombination dopants in the implanted dopants layer to form hydrogen-recombination doping region/layer over the solid layer. The mother substrate, the hydrogen-recombination doping layer and the solid layer constitute a supply substrate.

The supply substrate formed by each of the alternative processes 100, 110, 120 contains a high dose hydrogen-recombination doping region or layer that can be transformed into a hydrogen-embitterment layer with sufficiently high hydrogenated dopants to be utilized for layer splitting purposes as will be described in more detail with reference to FIG. 8. In each of the alternative processes for forming a supply substrate 100, 110, 120, the solid layer can also be doped with hydrogen-recombination poisons or retardant to retard hydrogen-recombination process and enhance the diffusion of hydrogen atoms into the hydrogen-recombination doping layer.

As noted above, FIG. 8 is a flowchart illustrating a process 130 for forming a hydrogen-embitterment layer in the supply substrate and a thin film is transferred from the supply substrate onto a target substrate utilizing the hydrogen-embitterment layer. In particular, at step 132, a hydrogen-embitterment region or layer is formed in the supply substrate by transporting hydrogen atoms therein. Hydrogen atoms may be transported into the supply substrate in any suitable manner, such as with the use of hydrogen plasma or an electrolytic process to hydrogenate the hydrogen-recombination doping layer.

In the case of the supply substrate forming process 100 shown in FIG. 5 in which the mother substrate with high hydrogen-recombination doping and the solid layer constitute the supply substrate, the hydrogen atoms are transported through the solid layer into the mother substrate with high hydrogen-recombination doping at a sufficiently long permeation depth to form a sufficiently thick hydrogen-embitterment layer in the supply substrate. In the cases of the supply substrate forming processes 110, 120 shown in FIGS. 6 and 7, respectively in which the mother substrate, the hydrogen-recombination doping layer and the solid layer constitute the sandwiched supply substrate, the hydrogen atoms are permeated into the sandwiched supply substrate to hydrogenate the hydrogen-recombination doping layer to form a hydrogen-embitterment layer.

Referring again to FIG. 8, after the hydrogen-embitterment layer is formed at step 132, the supply substrate is bonded to a target substrate into a bonded substrate pair using any suitable wafer bonding mechanism at step 134. At step 136, an external energy is applied to the bonded substrate pair to volatilize the hydrogen embitterment region, causing hydrogen voids and platelets to form and merge, resulting in splitting and transferring of the solid layer from the supply substrate onto the target substrate. Any suitable external energy may be applied, such as electromagnetic irradiation, including microwave irradiation, and/or thermal treatment. The external energy causes relaxation of hydrogen molecules in a hydrogen recombination process. Lastly, at step 138, remnants of the hydrogen-embitterment region/layer remaining of the solid layer, now transferred onto the target substrate, may be removed using any suitable method such as etching, polishing and/or annealing treatment.

As noted above, the hydrogenation of the high dose hydrogen-recombination doping region/layer to form the hydrogen-embitterment layer may be performed using hydrogen plasma and/or an electrolytic process. In addition, the external energy applied to cause the hydrogen recombination process may be, for example, electromagnetic irradiation including microwave irradiation and/or thermal treatment. Various exemplary processes using different combinations hydrogenation and/or external energy application methods as well as different process parameters will now be presented with reference to the table of FIG. 9. It is to be understood that these exemplary processes are merely illustrative of suitable processes and that various modification may be made to achieve similar results and/or advantages.

According to one preferred exemplary process, a mother substrate is a p-type, (100), 15-25 ohm-cm silicon wafer. A 1.5 μm thick silicon layer doped with boron/germanium ($2.0 \times 10^{20}/2.0 \times 10^{21}$ cm$^{-3}$) layer is epitaxially grown on the mother substrate. This epitaxy growth layer, referenced as a hydrogen-recombination doping layer, uses germanium to compensate lattice difference between boron and silicon to be free from lattice disorder in subsequent epitaxial growth of an undoped silicon solid layer on the hydrogen-recombination doping layer. The undoped silicon layer is the solid layer to be transferred from a supply substrate to a target substrate. The supply substrate is the combination of the hydrogen-recombination doping layer, the solid layer and the mother substrate.

To hydrogenate and transform the hydrogen-recombination doping layer into a hydrogen-embitterment layer, an atmospheric-pressure plasma jet and/or an electrolytic process can be applied. In the case of the plasma jet, the plasma can be generated by passing a mixture gas of hydrogen (10%) and argon (90%) through generation equipment and applying RF power at 13.56 MHz. The plasma gas steam is directed onto the supply substrate located 1.7 cm downstream and a substrate holder holding the supply substrate is kept below 150° C. for a predetermined period of time. After hydrogen processing, the hydrogen atoms do not accumulate to blister the surface of the substrate.

In the case of the electrolytic process, an electrolytic setup with an liquid electrolyte containing hydrogen ions such as a sulfuric acid solution may be employed in which the supply substrate is a cathode and a platinum electrode is an anode of the electrolytic cell. The electrolytic setup is charged for a predetermined period of time, e.g., 150 minutes, at a current density of, for example, 0.15 A/cm$^2$.

The hydrogenated supply substrate is bonded with a target substrate, e.g., a p-type (100), 15-25 ohm-cm silicon wafer covered by a 1.0 μm thick silicon dioxide film, by a low temperature wafer bonding method to obtain a sufficiently high bonding energy under a 180° C. annealing process. The bonded target-supply substrate pair is then subjected to an external energy application. For example, the bonded target-supply substrate pair may be placed in a microwave setup and irradiated at 2.45 GMz for five minutes. Alternatively, the bonded target-supply substrate pair may be placed in a heat treatment setup and heated at, for example, 800° C. for a predetermined period of time. The application of external energy separates the solid layer from the supply substrate, the solid layer being transferred onto the target substrate, resulting in a SOI wafer with an insulation layer of silicon dioxide.

According to another preferred exemplary process, a mother substrate is a p-type, (100), 12-25 ohm-cm silicon wafer. A top layer of approximately 0.5 μm thickness is defined by boron ion implantation at a dosage of $1 \times 10^4$/cm$^2$ and energy of 180 KeV. The top layer is the solid layer to be transferred from a supply substrate to a target substrate. An RTA process is performed to activate the implanted ions and eliminate the implant damages and defects at 900° C., 90 seconds and to format a hydrogen-recombination doping layer. The supply substrate is the combination of the layers and the mother substrate. An electrolytic setup as described above charged for 100 minutes at a current density of 0.15 A/cm$^2$ can be employed to hydrogenate the hydrogen-recombination doping layer of the supply substrate to form a hydrogen-embitterment layer.

The supply substrate is then bonded with a target substrate as described above and the bonded target-supply substrate pair is placed in a heat treatment setup and heated, for example, at 800° C. for 15 minutes. The application of heat separates the solid layer of about 0.4 μm thickness from the supply substrate, the solid layer having been transferred onto the target substrate, resulting in a SOI wafer with an insulation layer of silicon dioxide.

As is evident, the systems and methods for transferring a thin film from a substrate onto another substrate as described above can be utilized to transfer a think film of the same area as the substrate, of a thickness from sub-micron to tens of micron, and of the thickness and flatness required by VLSI and MEMS applications, and with sufficiently low defect density in the transferred laye. The layer transferring method is a cost-effective method for transferring a layer from one substrate onto another substrate with a similar or heterogeneous material structure, resulting in a substrate that is free from COPs defects.

While the preferred embodiments of the present invention are described and illustrated herein, it will be appreciated that they are merely illustrative and that modifications can be made to these embodiments without departing from the spirit and scope of the invention. Thus, the invention is intended to be defined only in terms of the following claims.

What is claimed is:

1. A method for separating a solid layer from a supply substrate, comprising the steps of:
    epitaxially depositing a solid layer on a surface of a hydrogen recombination region containing a hydrogen-recombination-dopant at a concentration higher than that of the solid layer, the solid layer and the hydrogen recombination region forming at least a portion of a supply substrate, the supply substrate including a mother substrate;
    promoting hydrogen atoms into the supply substrate to convert the hydrogen recombination region to a hydrogen-embitterment region; and
    volatilizing the hydrogen-embitterment region to form a void region.

2. The method of claim 1, further comprising a step of bonding the supply substrate to a target substrate prior to the volatilizing step.

3. The method of claim 1, wherein the supply substrate comprises a semiconductor material.

4. The method of claim 1, wherein the semiconductor material is selected from the group consisting of silicon, silicon carbide, germanium, silicon germanium alloy, gallium arsenide, gallium nitride, aluminum nitride, and indium phosphide.

5. The method of claim 1, wherein said hydrogen-recombination-dopant is selected from the group consisting of boron, gallium, aluminum and carbon.

6. The method of claim 1, wherein the mother substrate contains the hydrogen recombination region therein.

7. The method of claim 1, wherein, after the epitaxially depositing step, the hydrogen recombination region is disposed between the solid layer and the mother substrate.

8. The method of claim 1, wherein said epitaxial deposition method is selected from the group consisting of vapor phase epitaxy deposition, liquid phase epitaxy deposition, molecular beam epitaxy deposition, and metal-organic chemical vapor deposition.

9. The method of claim 1, wherein the hydrogen atoms are transported into the hydrogen-embitterment region by exposing the supply substrate to one of a gas containing hydrogen ions and hydrogen molecules, a plasma source containing hydrogen plasma, and a liquid containing hydrogen ions.

10. The method of claim 1, wherein the hydrogen atoms are transported by a driving force formed by one of a concentration gradient in hydrogen atomic concentration, heating, and an electrical field.

11. The method of claim 1, wherein the hydrogen-embitterment region is volatilized by a method selected from the group consisting of thermal treatment, microwave irradiation, magnetic field irradiation, electric field irradiation, radiation, and mixtures thereof.

12. The method of claim 1, wherein the void region is further formed to facilitate separation between the solid layer and the mother substrate.

13. A method comprising the steps of:
Implanting a hydrogen-recombination-dopant in a substrate;
annealing the implanted substrate to annihilate implant damage, activate the hydrogen-recombination-dopant, and expand implant profile to form a hydrogen-recombination region between a first solid layer and a second layer constituting a majority of the substrate, the hydrogen-recombination region containing hydrogen-recombination-dopant at a concentration higher than that of the first solid layer and the second layer;
promoting hydrogen atoms into the substrate to convert the hydrogen recombination region to a hydrogen-embitterment region; and
volatilizing the hydrogen-embitterment region to form a void layer between the first solid layer and the second layer.

14. The method of claim 13, further comprising the step of bonding the supply substrate to a target substrate prior to the volatilizing step.

15. The method of claim 13, wherein said substrate comprises a semiconductor material.

16. The method of claim 15, wherein the semiconductor material is selected from the group consisting of silicon, silicon carbide, germanium, silicon germanium alloy, gallium arsenide, gallium nitride, aluminum nitride, and indium phosphide.

17. The method of claim 13, wherein the hydrogen-recombination-dopant is selected from the group consisting of boron, gallium, aluminum and carbon.

18. The method of claim 13, wherein the hydrogen atoms are transported into the hydrogen-recombination region by exposing the supply substrate to one of a gas containing hydrogen ions and hydrogen molecules, a plasma source containing hydrogen plasma, and a liquid containing hydrogen ions.

19. The method of claim 13, wherein the hydrogen atoms are transported by a driving force formed by one of a gradient in hydrogen atomic concentration, heating, an electrical field.

20. The method of claim 13, wherein the hydrogen-embitterment region is volatilized by a method selected from the group consisting of thermal treatment, microwave irradiation, magnetic field irradiation, electric field irradiation, radiation, and mixtures thereof.

21. The method of claim 13, wherein said annealing the implanted substrate is performed at an elevated temperature of at least approximately 800° C.

22. The method of claim 13, wherein the void layer is further formed to facilitate separation between the first solid layer and the second layer.

* * * * *